United States Patent [19]
Zuercher

[11] Patent Number: 5,130,507
[45] Date of Patent: Jul. 14, 1992

[54] CAPACITIVE SWITCH ASSEMBLY

[75] Inventor: Joseph C. Zuercher, Brookfield, Wis.

[73] Assignee: Eaton Corporation, Cleveland, Ohio

[21] Appl. No.: 704,503

[22] Filed: May 23, 1991

[51] Int. Cl.⁵ .......................................... H03K 17/975
[52] U.S. Cl. ...................................... 200/600; 361/288
[58] Field of Search ...................... 200/600; 361/288; 307/116; 341/22, 33

[56] References Cited

U.S. PATENT DOCUMENTS

| | | | |
|---|---|---|---|
| 3,751,612 | 8/1983 | Hansen | 200/52 R |
| 3,965,399 | 6/1976 | Walker, Jr. et al. | 200/600 |
| 4,367,385 | 1/1983 | Frame | 200/159 B |
| 4,415,781 | 11/1983 | Frame et al. | 200/5 A |
| 4,454,562 | 6/1984 | Bush et al. | 361/288 |
| 4,490,587 | 12/1984 | Miller et al. | 200/5 A |
| 4,736,076 | 4/1988 | Mochizuki et al. | 200/52 R |
| 4,795,861 | 1/1989 | O'Rourke | 200/5 A |
| 4,857,683 | 8/1989 | Maser | 200/5 A |
| 4,857,684 | 8/1989 | Gratke | 200/600 |
| 4,876,461 | 10/1989 | Gratke | 307/116 |
| 4,899,063 | 1/1990 | Suck | 307/9.1 |
| 5,053,592 | 10/1991 | Zuercher | 200/553 |

Primary Examiner—J. R. Scott
Attorney, Agent, or Firm—R. A. Johnston

[57] ABSTRACT

A capacitive switch assembly formed on a glass substrate with one capacitive plate formed of a thin metal film deposited thereon covered by a dielectric spacer deposited thereover for spacing therefrom a second plate formed of conductive polymer paste screened on the dielectric spacer. Discontinuities are provided in the second plate which is brought in-circuit by a conductive elastomer shorting bar movable upon user actuation of the switch.

23 Claims, 1 Drawing Sheet

CAPACITIVE SWITCH ASSEMBLY

BACKGROUND OF THE INVENTION

The present invention relates to electric switching devices of the type employed for switching very small currents at relatively low voltages, as for example, switches employed in automotive applications in circuit arrangements operating from a 12 volt supply. In such automotive applications, it has become desirable to employ multiplexing techniques wherein the user input switches merely provide a signal to a microcomputer which generates control signals for appropriate relaying of switching power to various functional loads. Multiplexing arrangements of this type eliminate the need for much of the wiring in the vehicle needed to carry load currents to the various functions inasmuch as the connections from the user input switches to the microcomputer carry only a very small signal current, rather than load current.

In providing switches for multiplex systems, and particularly for automotive applications, it has been the practice to utilize existing user input switches to maintain the tactile characteristics and "feel" of the switching operations for user compatibility. However, the existing switches employed for typical automotive accessory applications such as window lift, actuation, and actuation of door lock solenoids have been designed to handle significant load currents and are thus overdesigned for multiplexing applications and thus add unnecessary costs in the switching arrangements.

It has therefore been desired to provide a reliable low voltage switch assembly, suitable for automotive multiplex applications which is low in manufacturing cost and capable of providing the long cycle life and environmental survivability required for automotive applications. Heretofore, it has been proposed to utilize a switch employing the sensing of changes in capacitance of a user-actuated capacitor to provide the low current low voltage switching for automotive multiplex applications. However, known techniques for providing capacitive switching have proven to be costly to manufacture and limited in capacitance per unit area and therefor prohibitive for high volume automotive passenger car usage.

SUMMARY OF THE INVENTION

The present invention provides a unique and novel capacitive switch assembly conveniently formed on a glass substrate with one capacitive plate formed of a thin metal film covered by a dielectric spacer chemically deposited thereover which controls the space between the first plate and a second plate which is formed of conductive polymer paste screened on the dielectric spacer. Discontinuities are provided in the upper plate which is brought in-circuit by a conductive elastomer shorting bar movable in response to user actuation of the switch. The switch assembly of the present invention provides an order of magnitude increase in capacitance-per-unit area as compared to commercially available membrane capacitive switches and therefor provides increased ability of the sensing circuitry to detect a change in switch condition and also enables the size of the capacitive plate area to be minimized. The present invention thus provides a reliable low cost capacitive switch assembly ideally suitable for low voltage switching applications, as for example, those found in automotive multiplex switch circuit systems.

DETAILED DESCRIPTION OF THE DRAWINGS

Figure 1:
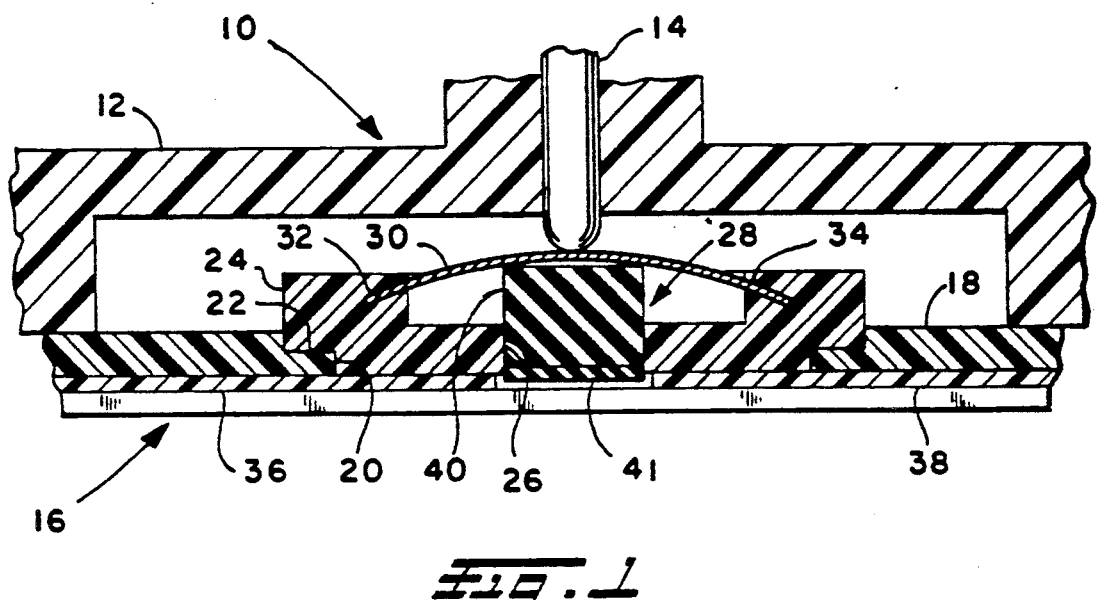
FIG. 1 is a portion of a cross-section enlarged, taken through the switch assembly at the point of actuation; and, FIG. 2 is an enlarged isometric view of the substrate and layered construction of the capacitive plates for the switch of FIG. 1.

Referring to FIG. 1, the switch assembly of the present invention is indicated generally at 10 as having a switch housing 12 in which is movably mounted an actuator 14 which is disposed for actuation by user movement in any suitable manner as, for example, connection to a toggle or rocker mechanism (not shown).

The switch housing 12 has mounted thereon a switch deck assembly indicated generally at 16 including the capacitive switching elements of the assembly 10 as will be hereinafter described. A detent plate 18 is registered against the housing 12 and has an aperture 20 provided therein which has a step surface 22 provided on opposite sides thereof. A detent block 24 is registered against the surfaces 22; and, the block 24 has an opening 26 provided therethrough in which is slidably received a plunger indicated generally at 28. Plunger 28 is retained therein by spring means 30 which preferably comprises a curved or bowed beam spring having the opposite ends thereof anchored in slots 32,34 provided in the block 24.

The switching deck 16 is spaced from the plate 18 by suitable spacers 36,38 of the desired thickness to control the actuation stroke of the plunger 28 as it is depressed in a downward direction by movement of the actuator 14.

It will be understood that upon downward movement of the plunger 14 the beam spring 30 undergoes a dimpling or contra-curvature in the central region thereof to provide a detent or local maximization of actuation force to the switching. The particulars of the force-detent arrangement of the beam spring are known in the art and are described in a co-pending application, commonly assigned to the assignee of the present application, Ser. No. 486,570, filed Feb. 28, 1990, now U.S. Pat. No. 5,053,592.

In the presently preferred practice, the plunger 28 comprises an upper portion 40 formed of non-conductive elastomeric material having a durometer of about 24 on the Shore "O" scale; and, the of the lower portion of the plunger 28 comprises a thin layer 41 of somewhat stiffer elastomeric material. The layer 41 is formed of electrically conductive elastomer having the presently preferred practice hardness of about 65 on the Shore "O" scale. The layer 41 is thus enabled to serve as a shorting bar for the switch actuation as will hereinafter be described.

Figure 2:
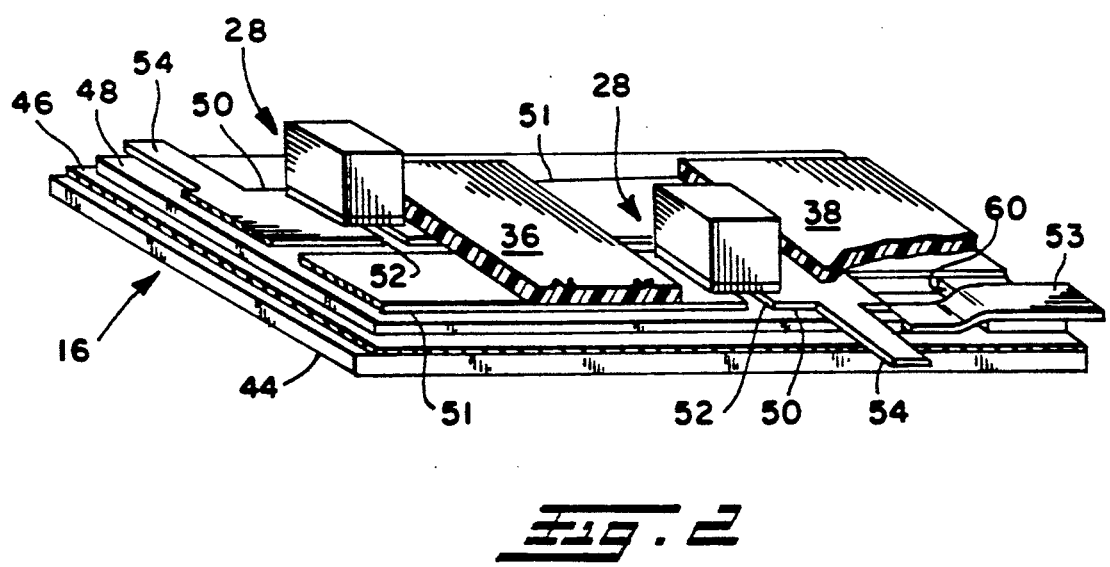

Referring to FIG. 2, the switching deck 16 is illustrated enlarged as having a preferably rigid base layer 44 formed of inexpensive rigid dialectric such as glass or quartz having an accurate flat surface upon which subsequent layers or films may be attached. The layer 44 may have any desired thickness suitable to provide rigidity and structural integrity for exposer to vibration or shock. The layer 44 may also be formed of other dielectric materials, such as plastic; and, polyimide plastic in particular.

The upper flat surface of plate 44 has deposited thereon a very thin film 46 of conductive, preferably metallic material which forms one plate of the switching capacitor. In the present practice of the invention, the thin film or layer 46 comprises a film applied by sputter of Chromium metal having a thickness of 2500 Angstroms (2500 A).

The lower capacitive plate or metal layer 46 may also be formed of copper material. A dielectric spacer layer 48 is applied over the metal layer 46 to provide the spacing for the plates of the capacitor. In the presently preferred practice, the layer 48 is formed of a dielectric material such as silicon oxide applied by chemical vapor deposition, and has a thickness in the range of 2000–4000 Angstroms (2000–4000 A).

The second plate 50 of the capacitive switching arrangement is formed over the dielectric 48 by a low temperature relatively thick film conductive material deposited on the dielectric 48. In the presently preferred practice, the layer 50 comprises a low temperature conducting polymer paste screened onto the dielectric 48 and having a thickness in the range 0.001 to 0.005 inches 0.025 to 0.13 mm) and preferably in the range 0.002 to 0.003 inches cured thereon.

The capacitive structure described hereinabove has been found to provide about 17.3 nanafarods of capacitance per square centimeter (17.3 nfds/cm$^2$) and having a thickness for the layer 48 of about 2000 Angstroms.

The upper metallic layer forming the second plate 50 of the capacitor has a discontinuity or space 52 formed therein which divides the upper plate into separate electrically isolated segments 50,51. It will be understood that switching is accomplished by downward movement of the plunger 28 causing the lower surface of the layer 40 to contact the upper plates 50,51 acting as a shorting bar or shunt thereacross to electrically connect plate segments 50 and 51 to provide sufficient area to the upper plate to create in association with the lower plate 46 adequate capacitance to provide the desired change in capacitive reactance to be detected for effecting switching action.

Electrical connector tab 53 is attached to the lower capacitive plate 46 through a void 60 formed in spacer layer 48.

Preferably void 60 is formed by shadow masking during deposition of spacer layer 48; and, tab 53 comprises a discrete portion of the screened-on thick film paste which forms the second capacitive plate segments 50,51.

A separate electrical connector tab 54 is connected to the upper segment 50 of the upper capacitive plate. It will be understood that two sets of upper capacitive plates, each with its own plunger 28, are illustrated in FIG. 2.

The present invention thus provides a low voltage low current capacitive switching assembly which permits the capacitive plate structure to be formed by deposition on a rigid glass plate and provides a high degree of sensitivity to changes in capacitive reactance in response to pressure applied to a conductive elastomeric shorting bar which connects isolated segments of the upper capacitive plate in circuit. The plates are of sufficient surface area electrically to provide a sudden change in capacitive reactance, which is electrically detectable as an indication of switch actuation. The present invention may be economically manufactured in high volume production and is therefor suitable for low cost applications such as passenger automotive multiplexing circuitry.

Although the invention has been described above with respect to the illustrated embodiments, it will be understood that the invention is capable of modification and variation and is limited only by the scope of the following claims.

I claim:

1. A capacitive switch assembly comprising:
   (a) a base formed of electrically non-conductive material;
   (b) a first layer disposed on the surface of said base and said first layer relatively thin with respect to the thickness of said base and formed of electrically conductive material;
   (c) a second layer disposed on said first layer and formed of dielectric material having a thickness on the order of said first layer;
   (d) a third layer disposed on said second layer and formed of conductive material with a thickness significantly greater than the thickness of said first or second layer but substantially less than said base, said third layer having at least one electrical discontinuity therein dividing said third layer into separate electrically isolated segments.
   (e) plunger means movable with respect to said base between an actuated and an unactuated position, said plunger means including a portion formed of electrically conductive elastically deformable material operative in said actuated position to span said discontinuity and electrically connect said segments, wherein said first and third layers are electrically effective as a capacitor in said actuated position of said plunger means; and,
   (f) connector means on each of said first and third layers, adapted for connection to an electrical circuit.

2. The switch assembly defined in claim 1, wherein said first layer is formed of substantially chromium material.

3. The switch assembly defined in claim 1, wherein said third layer is formed of screened on polymer paste cured on said dielectric material.

4. The switch assembly defined in claim 1, wherein said first layer has a thickness of about two thousand five hundred Angstroms (2500A).

5. The switch assembly defined in claim 1, wherein, said second layer has a thickness in the range of two thousand to six thousand Angstroms (2000–6000 A).

6. The switch assembly defined in claim 1, wherein said third layer has a thickness in the range of 0.025–0.13 mm.

7. The switch assembly defined in claim 1, wherein said plunger means comprises a member formed of relatively soft non-conductive elastomer having provided thereon a layer of conductive elastomer having relatively greater stiffness than said non-conductive elastomer.

8. The switch assembly defined in claim 1, wherein said base is formed of material selected from the group consisting essentially of (a) silicon oxide ($S_iO_2$), (b) quartz, and (c) plastic.

9. The switch assembly as defined in claim 1, further comprising spring means having a detent action upon movement of said plunger means to said unactuated position.

10. The switch assembly defined in claim 9, wherein said spring means includes a bowed beam spring.

11. The switch assembly defined in claim 1, wherein said base includes structure operative to guide said plunger means for sliding movement between said first and second positions.

12. The switch assembly defined in claim 1, wherein said base has a generally thin flat-plate configuration having said first layer disposed on one flat surface thereof.

13. The switch assembly defined in claim 1, wherein said third layer has plural discontinuities therein; and, said plunger means includes a separate individual member for spanning each of said discontinuities.

14. The switch assembly defined in claim 1, wherein said base is formed of pyrolytic glass material.

15. The switch assembly defined in claim 1, wherein said second layer is formed of oxide material deposited by chemical vapor deposition.

16. The switch assembly defined in claim 1, wherein said second layer is formed of silicon oxide material.

17. The switch assembly defined in claim 1, wherein said first and third layers have a capacitance of 10–20 nanafarods per square centimeter (10–20 nfd/cm$^2$)

18. The switch assembly defined in claim 1, wherein said third layer is formed of conductive polymer material.

19. The switch assembly defined in claim 1, wherein said plunger means comprises a non-conductive elastomer having a thin layer of flexible metallic material thereon.

20. A method of making a capacitive switching assembly comprising the steps of:
 (a) depositing a layer of conductive materials on a dielectric substrate and forming one plate of a capacitor;
 (b) vapor depositing a spacer layer of dielectric material over said conductive material;
 (c) depositing a layer of conductive paste on said spacer layer, and dividing said layer into a plurality of electrically isolated segments;
 (d) curing said paste to form a second plate of a capacitor; and,
 (e) providing a shorting bar for shunting between said divided segments of said second plate.

21. The method defined in claim 20, wherein the step of depositing a layer of paste includes the step of screening said paste.

22. The method defined in claim 20, wherein said step of depositing said conductive layer includes the step of sputter coating said substrate.

23. The method defined in claim 20, wherein the step of vapor depositing said dielectric includes the step of masking and forming a void in said layer; and, said step of depositing said paste includes the step of depositing said paste through said void on said conductive layer.

* * * * *